US008571082B2

(12) United States Patent  
Belenky et al.

(10) Patent No.: US 8,571,082 B2
(45) Date of Patent: Oct. 29, 2013

(54) QUANTUM CASCADE LASERS WITH ELECTRICALLY TUNABLE EMISSION WAVELENGTHS

(75) Inventors: Gregory Belenky, Port Jefferson, NY (US); John D. Bruno, Bowie, MD (US); Mikhail V. Kisin, Carlsbad, CA (US); Serge Luryi, Setauket, NY (US); Leon Shterengas, Coram, NY (US); Sergey Suchalkin, Centereach, NY (US); Richard L. Tober, Elkridge, MD (US); Mikhail Belkin, Austin, TX (US)

(73) Assignees: Maxion Technologies, Inc., College Park, MD (US); The Research Foundation of State University of New York, Albany, NY (US); Board of Regents, The University of Texas System, Austin, TX (US)

( * ) Notice: Subject to any disclaimer, the term of this patent is extended or adjusted under 35 U.S.C. 154(b) by 149 days.

(21) Appl. No.: 13/012,627

(22) Filed: Jan. 24, 2011

(65) Prior Publication Data

US 2012/0120972 A1    May 17, 2012

Related U.S. Application Data

(63) Continuation-in-part of application No. 11/206,505, filed on Aug. 18, 2005, now Pat. No. 7,876,795.

(60) Provisional application No. 60/602,750, filed on Aug. 19, 2004.

(51) Int. Cl.
*H01S 5/00* (2006.01)
*H01S 3/10* (2006.01)

(52) U.S. Cl.
USPC ....... 372/46.01; 372/20; 372/50.1; 372/50.11

(58) Field of Classification Search
None
See application file for complete search history.

(56) References Cited

U.S. PATENT DOCUMENTS

| 4,622,671 | A |   | 11/1986 | Tsang |
|---|---|---|---|---|
| 5,119,393 | A | * | 6/1992 | Oka et al. .................. 372/50.22 |
| 5,333,141 | A |   | 7/1994 | Wolf et al. |
| 5,588,015 | A |   | 12/1996 | Yang |
| 5,799,026 | A |   | 8/1998 | Meyer et al. |
| 5,901,168 | A |   | 5/1999 | Baillargeon et al. |
| 5,978,397 | A |   | 11/1999 | Capasso et al. |
| 6,404,791 | B1 |   | 6/2002 | Yang |
| 2003/0043877 | A1 |   | 3/2003 | Kaspi |

OTHER PUBLICATIONS

Sirtori et al., "Quantum cascade unipolar intersubband light emitting diodes in the 8-13 μm wavelength region", Appl. Phys. Lett., Jan. 2, 1995, pp. 4-6, vol. 66(1).
Faist et al., "Laser action by tuning the oscillator strength", Nature, Jun. 19, 1997, pp. 777-782, vol. 387.

(Continued)

*Primary Examiner* — Jessica Stultz
*Assistant Examiner* — Sean Hagan
(74) *Attorney, Agent, or Firm* — Alan G. Towner, Esq.; Pietragallo Gordon Alfano Bosick & Raspanti, LLP

(57) ABSTRACT

The present invention provides a QCL device with an electrically controlled refractive index through the Stark effect. By changing the electric field in the active area, the energy spacing between the lasing energy levels may be changed and, hence, the effective refractive index in the spectral region near the laser wavelength may be controlled.

8 Claims, 9 Drawing Sheets

(56) References Cited

OTHER PUBLICATIONS

Simanowski et al., "Growth and layer structure optimization of 2.26 μm (AlGaIn)(AsSb) diode lasers for room temperature operation", J Crystal Growth 227-228, 2001, pp. 595-599.

Sherstnev et al., "Tuning characteristics of InAsSb continuous-wave lasers", Applied Physics Letters, May 20, 2002, pp. 3676-3678, vol. 80, No. 20.

Thomas et al., "Widely tunable ligh-emitting diodes by Stark effect in forward bias", Applied Physics Letters, Aug. 26, 2002, pp. 1582-1584, vol. 81, No. 9.

Vasilyev et al., "Injection cascade lasers with graded gap barriers", Journal of Applied Physics, May 1, 2003, pp. 2349-2352, vol. 93, No. 5.

Thomas et al., "Tunable laser diodes by Start effect", Applied Physics Letters, Aug. 18, 2003, pp. 1304-1306, vol. 83, No. 7.

* cited by examiner

QUANTUM CASCADE LASERS WITH ELECTRICALLY TUNABLE EMISSION WAVELENGTHS

CROSS-REFERENCE TO RELATED APPLICATIONS

This application is a continuation-in-part of U.S. patent application Ser. No. 11/206,505 filed Aug. 18, 2005, which claims the benefit of U.S. Provisional Patent Application Ser. No. 60/602,750 filed Aug. 19, 2004, both of which are incorporated herein by reference.

FIELD OF THE INVENTION

This invention relates generally to the field of tunable lasers and, in particular, to electrically tunable quantum cascade lasers (QCLs).

BACKGROUND INFORMATION

Tunable semiconductor light sources such as lasers are in high demand for various applications such as countermeasures, remote sensing, environmental monitoring, and industrial process control. In tunable lasers, the wavelengths of the emitted radiation can be varied in a controlled manner.

Tunable mid-infrared (MID-IR) lasers in the wavelength region between 3 and 12 microns are now in high demand. Molecular absorption lines of various chemical substances such as water, carbon monoxide, sulfur, carbon and nitrogen dioxides, methane, nitric oxide, acetylene, ozone, ammonia, formaldehyde, etc. are within the specified wavelength range. The magnitude of the radiation absorption at a resonant wavelength is proportional to the concentration of the corresponding substance. The wavelength of the radiation source should be exactly matched to the absorption line of the substance detected, therefore, the tuning range of the radiation source is one of the most important parameters of the device.

There are two basic ways to control the frequency of radiation. The first method uses the change of the characteristic frequencies of light emitter material or structure as a result of changing the structure, temperature, current, voltage, strain or other control parameters. The second method involves selection of different frequencies from a sufficiently broad emission spectrum of the light emitter. The latter approach is mostly applicable to semiconductor lasers and is based on the control of the frequency dependent cavity loss and/or effective refraction index, which can be used to select the emission frequency. This method can be realized in an external cavity semiconductor laser.

The first method generally provides wider tuning range than the second, since in the latter case the tuning range is restricted by the width of the emission or amplification spectrum of the emitter. Conventional tunable semiconductor emission sources in the MID-IR range are lead-salt and antimonide-based lasers and light-emitting devices (LED), and recently implemented quantum cascade lasers (QCL). The lead salt laser diodes cover a spectral range from 3 to 30 microns. Rough wavelength tuning is done by controlling the device temperature. The tunability range of a single device can reach up to 10% of the central wavelength. Diode lasers based on (AlGaIn)(AsSb) system work in the 2-3 micron range (Simanowski S, Mermelstein C, Walther M, Herres N, Kiefer R, Rattunde M, Schmitz J, Wagner J, Weimann G, Journal of Crystal Growth, 227, 595 (2001)) with the temperature tuning wavelength range amounting to about 4 to 5% of the central wavelength.

One of the ways to tune the laser wavelength continuously is to control the effective refractive index of the laser mode. A conventional approach achieves control over the effective refractive index through the temperature of the device. A drawback of this method is a low tuning speed, which is limited by the thermal mass of the device.

In addition to temperature tuning, injection current tuning is commonly used for fine wavelength adjustment. Laser tunability over 7.5 cm$^{-1}$ by changing the bias current and 3.5 cm$^{-1}$ by changing the heat sink temperature have been reported for InAsSb cw lasers emitting at 3.3 μm (V. Sherstnev, A. Krier, A. Popov, P. Verle, Appl. Phys. Lett. 80, 3676 (2002)). Despite the fact that temperature control provides a good method for coarse wavelength tuning, it is electrical tuning that provides the finest frequency adjustment and the fastest time response. The range of the electrical tuning in both lead salt and antimonide based MID-IR diode lasers and LEDs is relatively small, so that the electrical tuning in these devices can be used only in combination with temperature tuning, which sometimes provides a wide enough tuning range.

The physical reason for electrical wavelength tuning can be either the change of the effective refraction index of the active area with the bias current or the change of the optical transition energy due to the change of the voltage drop across the active region (Stark shift). The Stark effect is an effective tool for broad wavelength tuning. Quantum cascade unipolar intersubband light emitting devices electrically tunable in the 8-13 micron range were reported by C. Sirtori, F. Capasso, J. Faist, D. Sivco, A. Hutchinson and A. Cho (APL, v.66, 4 (1995)).

Light-emitting diodes with a Stark tuning range over 100 nm in the 900 nm spectral region have been recently demonstrated (N. Le Thomas, N. T. Pelekanos, Z. Hatzopoulos, E. Aperathitis, R. Hamelin, Appl. Phys. Lett., 81, 1582 (2002)). The possible application of this principle to laser tuning was reported by J. Faist, F. Capasso, C. Sirtori, D. L. Sivco, A. L. Hutchinson and A. Y. Cho (Nature, v.387, 777 (1994)), N. Le Thomas, N. T. Pelekanos, Z. Hatzopoulos, E. Aperathitis and R. Hamelin (Appl. Phys. Lett., 83, 1304 (2003), and Yu. Vasilyev and S. Suchalkin (Electron. Lett., 35, 1563 (1999)).

However, the suggested schemes have serious drawbacks. The design suggested by N. Le Thomas, N. T. Pelekanos, Z. Hatzopoulos, E. Aperathitis, R. Hamelin in Appl. Phys. Lett., 83, 1304 (2003) utilizes the emitter based on a "rectangular" type I quantum well, so the Stark shift is a weak, second-order effect. In the designs suggested by J. Faist, F. Capasso, C. Sirtori, D. L. Sivco, A. L. Hutchinson and A. Y. Cho (Nature, v.387, 777 (1994)) and by Yu. Vasilyev and S. Suchalkin (Electron. Lett., 35, 1563 (1999)), the charge accumulation region is not separated from the active layers of the emitter. This makes it difficult to use such designs for laser wavelength tuning since the carrier concentration in the emitter is pinned after the laser generation onset, and hence, the generation wavelength cannot be controlled through the Stark shift unless a controlled optical loss is introduced into the laser cavity.

SUMMARY OF THE INVENTION

There is a need for an emission source that allows for wide-range electrical tuning of the emission wavelength. The present invention provides a QCL device with an electrically controlled refractive index through the Stark effect. By changing the electric field in the active area, the energy spacing between the lasing energy levels may be changed and, hence, the effective refractive index in the spectral region near the laser wavelength may be controlled. In one embodiment, a charge accumulation region is provided in the injector sections that precede each active light emitting section of each cascade of the QCL. A relatively thick barrier may be used to separate the injection section from the active section in each cascade of a QCL. Effective decoupling may be achieved between the gain pinning and excess carrier density pinning in the QCL at the lasing threshold so that increased current above the laser threshold leads to a larger Stark shifting of the lasing optical transition, and hence, to effective emission wavelength tuning.

An aspect of the present invention is to provide a tunable quantum cascade laser comprising an optically active region including at least one cascaded stage comprising an injection section and an active section, wherein the injection and active sections are separated by a barrier layer and comprise multiple quantum well layers and barrier layers, and each active section supports electronic states that provide for a lasing optical transition whose energy separation is controlled by the application of an applied electric field, means for pumping electrons through the active region by applying a bias voltage to the optically active region with a pair of conducting layers disposed on opposite sides of the optically active region, means for modulating a transverse electric field in the optically active section of each cascaded stage after a lasing threshold is reached by changing the bias voltage that is applied to the optically active region by the pair of conducting layers thereby modulating wavelengths of laser light emitted in the lasing optical transition between electronic states in the active section of each cascaded stage, a region located proximal to one side of the optically active region comprising a grating structure that provides for wavelength selective reflections of optical waves propagating through the optically active region, and means for confining optical waves to the active section.

Another aspect of the present invention is to provide a tunable quantum cascade laser comprising an optically active region including at least one cascaded stage comprising an injection section and an active section, wherein the injection and active sections are separated by a barrier layer and comprise multiple quantum well layers and barrier layers, and each active section supports electronic states that provide for a lasing optical transition whose energy separation is controlled by the application of an applied electric field, means for pumping electrons through the active region by applying a bias voltage to the optically active region with a pair of conducting layers disposed on opposite sides of the optically active region, a region located proximal to one side of the optically active region comprising a grating structure that provides for wavelength selective reflections of optical waves propagating through the optically active region, a refractive index variation and current extraction region located proximal to the optically active region comprising multiple quantum wells that support energy levels with optical transition energies greater than a lasing energy which change the refractive index of the refractive index variation and current extraction region when biased by an electric field and thereby change the effective refractive index of an optical mode propagating through the optically active region, means for applying a separate bias across the refractive index variation and current extraction region, means for applying a separate bias across the optically active region layer comprising contact layers disposed on opposite sides of the optically active region layer with one such contact layer in common with one of the refractive index variation and current extraction region contact layers, and means for confining optical waves to the active section.

These and other aspects of the present invention will be more apparent from the following description.

BRIEF DESCRIPTION OF THE DRAWINGS

FIG. 9A illustrates the optical mode showing its overlap with both the active region and the RIV layer (thin slice on the right of the modal maximum intensity). FIG. 9B illustrates the variation of the RIV layer's refractive index (real and imaginary parts) as a function of the bias voltage across the RIV layer. FIG. 9C illustrates the frequency detuning (from the laser frequency) and the associated waveguide losses associated with the RIV layer's presence in the overall laser structure as a function of the applied voltage across the RIV layer.

DETAILED DESCRIPTION

In one embodiment of the invention, the refractive index in a QCL is controlled through Stark tuning of the optical gain maximum frequency ($\omega_L$) with respect to lasing frequency. Important advantages of this approach include: high wavelength modulation speed (the modulation frequency is in GHz range), no additional absorption loss is introduced, and device processing is simpler and less expensive since no additional electrode is required. Since Stark tuning can shift wavelength in a direction opposite to that due to thermal tuning, this approach can also be used for stabilization of the laser wavelength for the devices operating in a low modulation frequency mode.

A typical gain curve of a QCL laser is highly symmetrical, so according to the Kramers-Kronig relations the contribution of the lasing transition to the effective refraction index of the laser mode is zero as long as the lasing wavelength corresponds to the maximum of the gain. To make this contribution nonzero one has to introduce a detuning between the lasing frequency and the maximum of the gain curve. This can be arranged in distributed feedback (DFB) or distributed Bragg reflector (DBR) lasers where the laser wavelength is determined by the parameters of the cavity and the effective refraction index.

The main technical challenge for implementing this approach is that the requirement of the optical gain pinning after the threshold effectively freezes the carrier concentration in the laser active region and the voltage drop across the optical quantum wells. This leads to reduced Stark tunability even if the voltage drop across the laser is controlled. One way to solve this problem is to introduce a thick tunnel barrier separating the laser active area from the injector. As the injection current increases above threshold, electrons start accumulating in the superlattice injector wells adjacent to the tunnel barrier. Their concentration determines the tunneling rate into upper laser energy level. This redistribution of charge in the injector results in an electric field perpendicular to the epi-layers that increases with the injection current. The energies of the states in the active area and, hence, emission wavelength λ become dependent on the bias current which controls the electric field. The concentration of the accumulated carriers depends on the ratio between the characteristic time associated with the tunneling through the injection barrier and the lifetime of the upper lasing state. A thick injection barrier leads to carrier accumulation near the active area. This tunnel-limited injection approach has been successfully demonstrated in interband cascade lasers (ICL), where record electrical tuning of the lasing wavelength was achieved.

Figure 1:
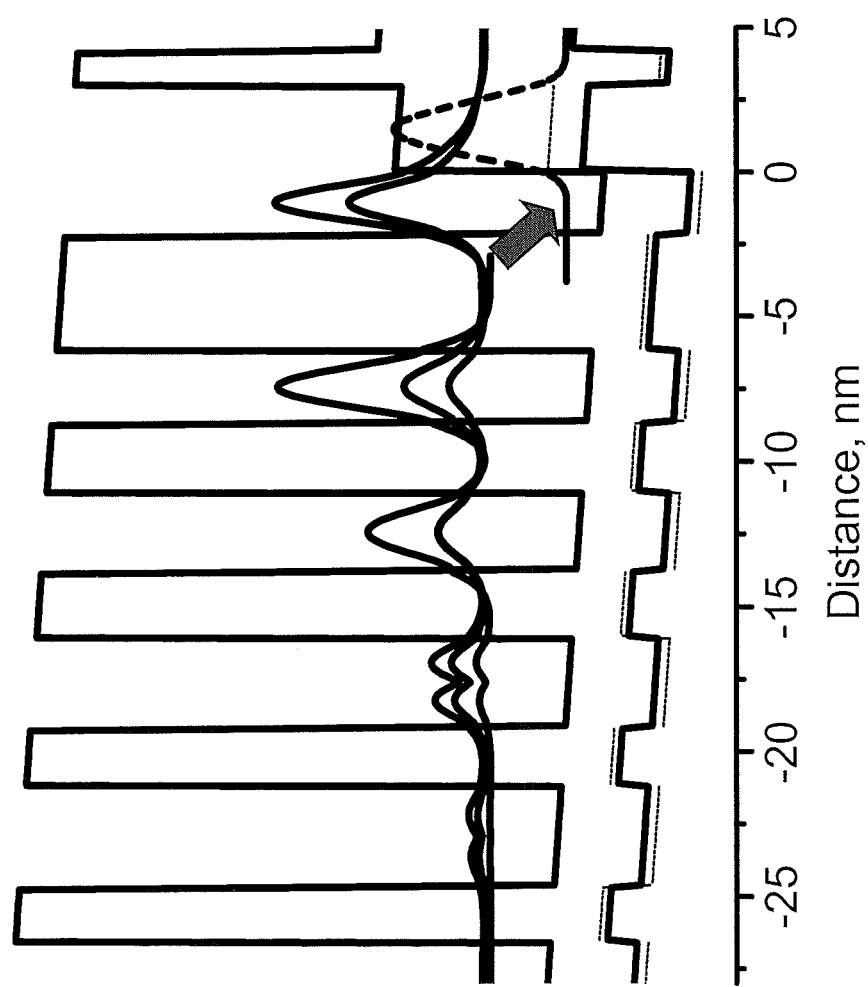
FIG. 1 is a band diagram of a tunable interband cascade laser (ICL) in an electric field.

The band diagram of a tunable ICL is presented schematically in FIG. 1. The solid lines are conduction and light, and the dotted lines are heavy hole band edges. The curves are probability densities of the electron and hole states involved in the laser transition. The arrow indicates the optical transition.

Figure 2B:
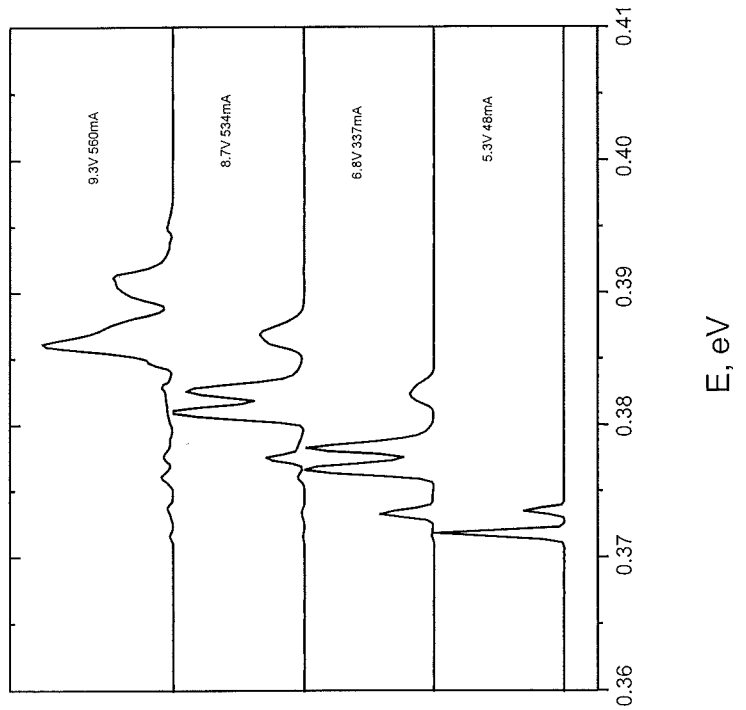
FIG. 2 illustrates the electrical tuning of an ICL with a 40A AlSb injection barrier (right panel) and spectra of the reference laser with a 24A tunnel barrier (left panel).
Figure 2A:
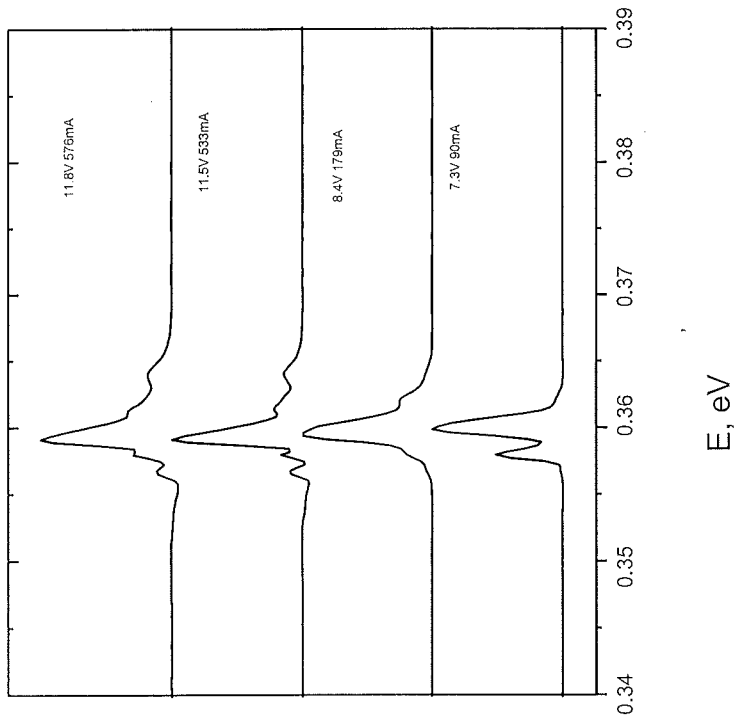

The ICL spectral tuning in the range of about 18 meV is shown in FIG. 2B. Electrical tuning of the tunable ICL with a 40A AlSb injection barrier (right panel) is compared with the electrical tuning of the reference ICL with a 24A tunnel barrier (left panel).

The difference between the QCL tuning approach of the present invention and the approach used for ICL tuning is that the lasing wavelength of the QLC is controlled by a variation of the effective refractive index of the laser mode, so continuous tuning of a single mode laser without mode hopping is possible.

Figure 3:
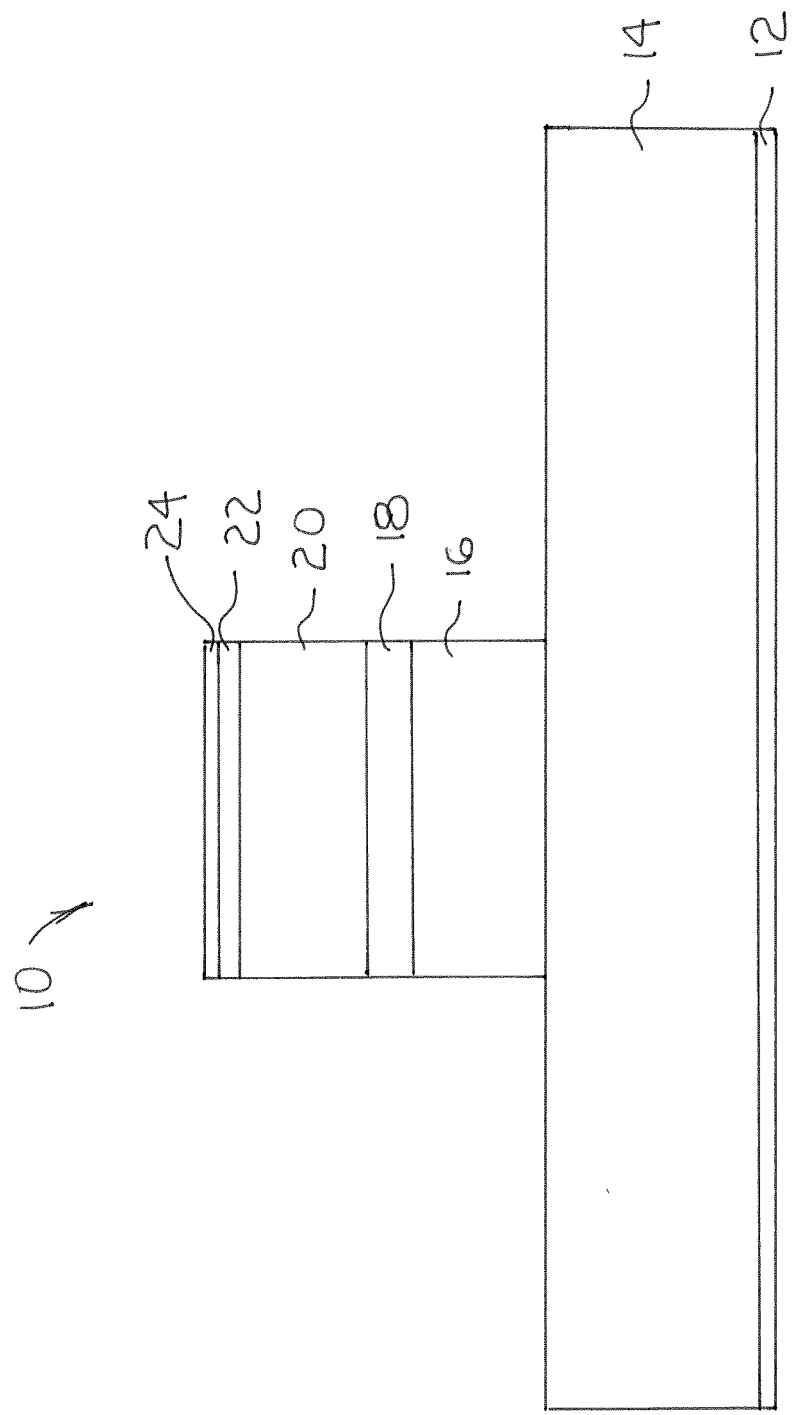
FIG. 3 is a partially schematic diagram of a tunable QCL in accordance with an embodiment of the present invention.

FIG. 3 illustrates a tunable QCL 10 in accordance with an embodiment of the present invention. As shown in FIG. 3, the tunable QCL 10 includes a ground layer 12 made of an electrically conductive material such as titanium, nickel, gold, or platinum having a thickness of from about 0.1 micron to about 1 micron. A conductive substrate and waveguide cladding layer 14 contacts the ground layer 12. The waveguide cladding layer 14 may be made of conductive material such as InP, InAs, GaSb, GaAs, InSb and the like having a thickness of from about 50 micron to about 500 micron. An active region 16 is provided on the waveguide cladding layer 14. The active region 16 typically has a thickness of from about 1 micron to about 4 micron, and is comprised of layers of GaInAs and AlInAs. GaSb, InAs, AlSb, GaAs, AlGaAs, InSb could also be used. A DFB grating region 18 is provided above the active region 16. The DFB grating region 18 may be made of GaInAs, AlInAs, GaSb, InAs, AlSb, GaAs, AlGaAs or InSb, having a thickness of from about 0.5 micron to about 2 micron. A waveguide cladding layer 20 is provided on the DFB grating region 18. The waveguide cladding layer 20 may be made of AlInAs, GaInAs, GaSb,AlSb, GaAs or AlGaAs, having a thickness of from about 1 micron to about 5 micron. A relatively highly doped plasmon confinement layer 22 is provided on the waveguide cladding layer 20. The plasmon confinement layer 22 may be made of InP, InAs, GaSb, GaInAs, AlInAs or InSb doped with higher levels of doping than used in the layer closer to the active region, having a typical thickness of from about 0.5 micron to about 2 micron. A laser bias layer 24 is provided on the doped plasmon confinement layer 22. The laser bias layer 24 may be made of titanium, nickel, gold, or platinum having a thickness of from about 0.1 micron to about 1 micron.

Figure 4:
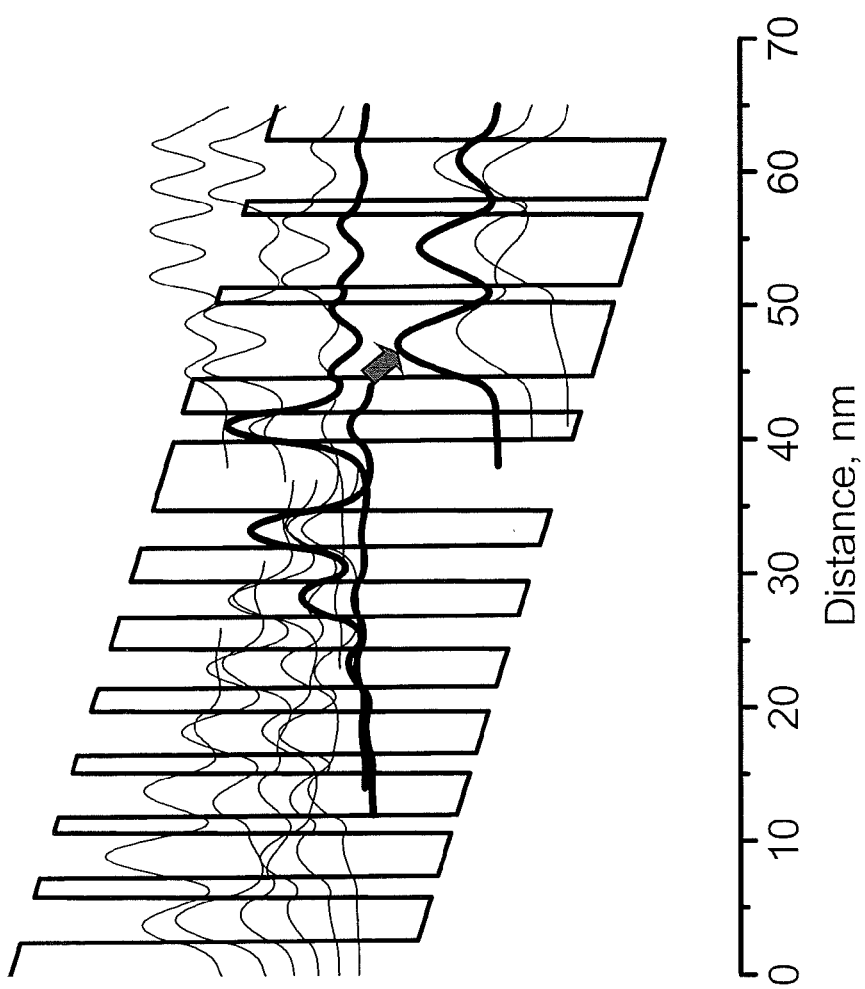
FIG. 4 is a band diagram of a tunable $Ga_{0.47}In_{0.53}As/Al_{0.48}In_{0.52}As$ QCL structure under its operating bias voltage.

To increase electric field tunability, a QCL active region is provided with a diagonal laser transition in which the centers of the electron wavefunctions for the upper and lower laser states have some spatial separation. An example of such a structure's band diagram is shown in FIG. 4. The layer thicknesses for this structure, in nm, starting from the extraction barrier, are 2.5/3.4/1.4/3.3/1.3/3.2/1.5/3.1/1.9/2.9/2.3/2.7/2.5/2.7/5.2/2.2/2.5/5.7/1.1/5.4/1.2/4.5 where the $Al_{0.48}In_{0.52}As$ barriers are shown in bold. The wavy curves are calculated probability densities of the electron states. Upper and lower laser states are shown in thick lines. A wavy curve indicates a state where carrier accumulation occurs, and the arrow indicates the optical transition.

A single, two- (or multiple-) phonon depopulation scheme may be used to produce high performance devices. Two-phonon-resonance QCLs with diagonal laser transitions have been shown to provide high performance at room-temperature. The devices of the present invention have active region designs conceptually similar to that of such conventional devices, but the lasers of the present invention additionally utilize thicker injection barriers to achieve sufficient carrier accumulation in the injector.

Figure 5:
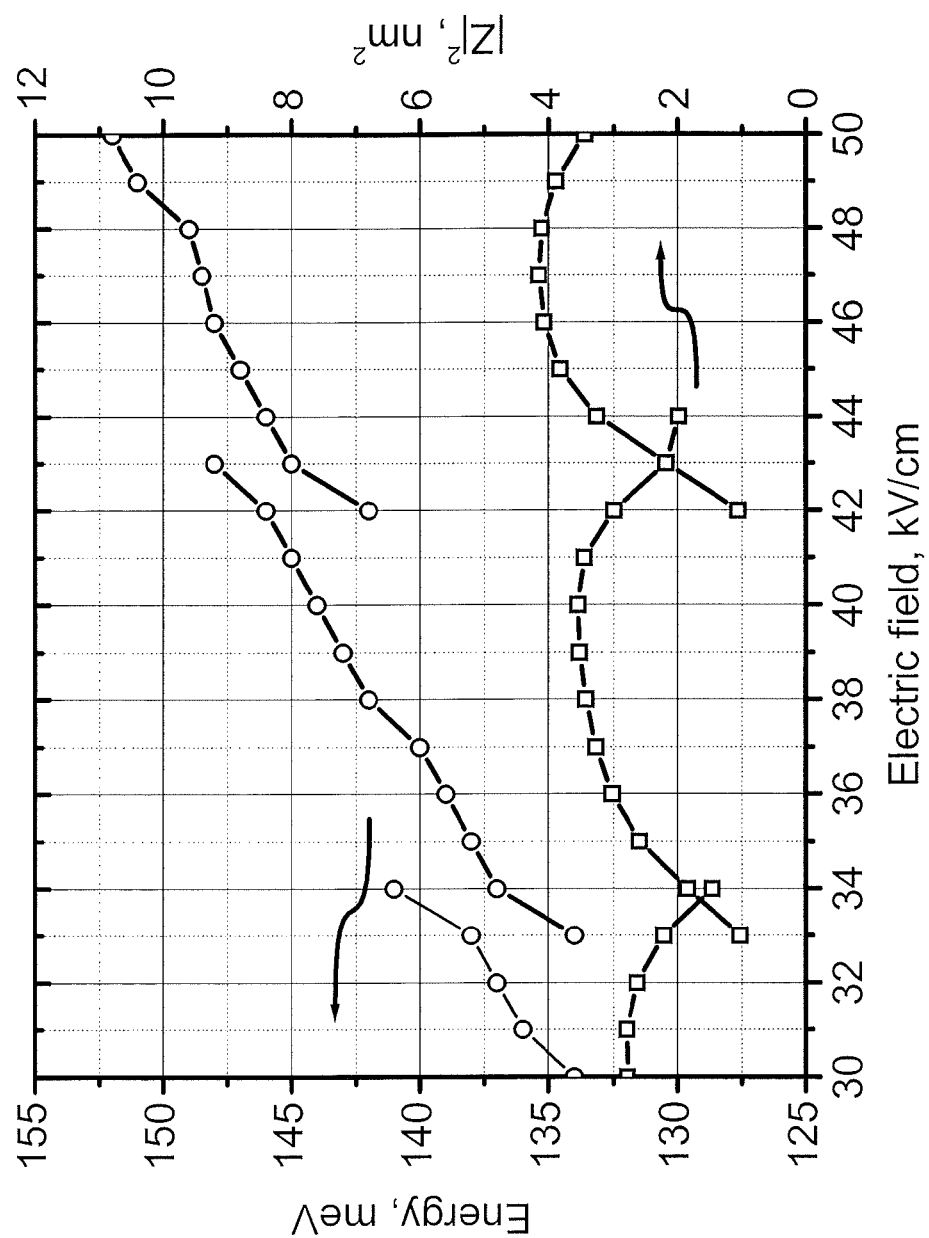
FIG. 5 illustrates the electric field dependence of the QCL optical transition energy and the corresponding dipole matrix elements.

FIG. 5 shows calculated transition energies between laser states in the structure displayed in FIG. 4 under different bias fields in the active region. Calculations were done in the single electron approximation using an 8 band k·p method. Jumps in the electric field dependence of the optical transition energies are due to anticrossings between the energy levels of the upper laser state and the injector states.

The results shown in FIG. 5 indicate that the laser transition energy can be Stark-tuned by over 15 meV by varying the electric field in the active region from 30 kV/cm to 50 kV/cm. This shift is comparable to a typical gain bandwidth of approximately 25 meV full width at half maximum of a mid-infrared QCL at 300K.

To estimate the dependence of the electric field F (in the part of a QCL structure where the laser states are located) on the current density through the laser structure, we need to calculate the amount of charge accumulated in the "charge accumulation" injector state (line in FIG. 4) at different current densities. To do that, we use the Kazarinov and Suris expression for tunneling transport $$J = eN \frac{2\Omega^2 \tau_p}{1 + \delta^2 \tau_p^2 + 4\Omega^2 \tau_p \tau_u}, \quad (1)$$

where $2\hbar\Omega$ is the energy splitting between the upper laser state and the adjacent injector state (upper curves in FIG. 4, respectively), N is 2D electron concentration in the injector state, $\tau_u$ is the lifetime of the upper laser state, $\tau_p$ is the relaxation time of electron in-plane momentum, and $\delta$ is the detuning of the upper laser and injector states:

$$\hbar\delta \approx ea\Delta F; \Delta F \equiv F - F_{res} \quad (2).$$

Here F is the electric field in the active region, $a \approx 10$ nm is the effective distance between resonantly coupled injector state and upper lasing state (bold upper curves in FIG. 4, respectively), $F_{res}$ is the electric field at which the injector state and the upper lasing state have same energy. In the first approximation we assume that in the entire voltage range of the laser tuning, the effective transport time does not depend on voltage. This approximation is justified as long as $|\delta\tau_p| < \sim 1$ which, for $\tau_p = 0.04$ ps, means that $\Delta F < 16$ kV/cm.

A 2D electron concentration is used in the injector state instead of the average electron concentration in the active area in Eq. (1). This modification of the original expression by Kazarinov and Suris takes into account the possibility of charge redistribution among the injector states as the bias current is changed. Near the resonance the expression (1) can be rewritten as $$N \approx \frac{J}{e}\tau_t, \quad (3)$$

where $\tau_t$ is the effective escape time from the injector level:

$$\frac{1}{\tau_t} \equiv \frac{2\Omega^2 \tau_p}{1 + 4\Omega^2 \tau_p \tau_u} \quad (4)$$

Taking $\tau_p$ as 0.04 ps [8], $\tau_u \approx 0.5$ ps [8,9] and $2\hbar\Omega \approx 2$ meV for a QCL structure with a 52A injector barrier (FIG. 4), we obtain $\tau_t = 6.4$ ps. Increases in the current through the QCL structure at the operational bias voltage leads to carrier accumulation in the injector state. This, in turn, leads to an increase of the electric field in the active area of the device. We can estimate an additional electric field $\Delta F$ produced in a part of a QCL structure where the upper and lower laser states are located by increasing laser current density above threshold as $$\Delta F \approx \frac{e(N - N_{th})}{\varepsilon_0 \varepsilon} = \frac{\tau_t}{\varepsilon_0 \varepsilon}(J - J_{th}). \quad (5)$$

where $\varepsilon \approx 13$ is a DC dielectric constant of undoped InGaAs and AlInAs, J and $J_{th}$ are the current density through the laser and threshold current density through the laser, respectively, and N and $N_{th}$ are the 2D electron concentration accumulated in the injector state at current densities of J and $J_{th}$, respectively. According to Eq. (5), the electric field in the active area can be increased by $\Delta F \approx 18$ kV/cm by increasing the current density through the device from $J_{th}$ to $J_{th} + 3200$ A/cm² and $\tau_t \sim 6.4$ ps.

As the electric field across the QCL active area increases, the center of the laser gain spectrum shifts in accordance with a trend shown in FIG. 5. The shift in the position of the laser gain will lead to a change of the effective refractive index of a laser mode at a particular frequency. A QCL gain spectrum can be approximated as:

$$G(\omega) = G_0 \cdot \frac{\gamma_{12}\omega}{(\omega_{12}(F) - \omega)^2 + \gamma_{12}^2} \quad (6)$$

where F is electric field and $G_0$ is determined as [10]:

$$G_0 \equiv \frac{J\tau_1\left(1 - \frac{\tau_2}{\tau_{12}}\right)N_P\Gamma_P e|Z_{12}|^2}{\varepsilon_0 \hbar L_P n_{eff} c} \quad (7)$$

Figure 6:
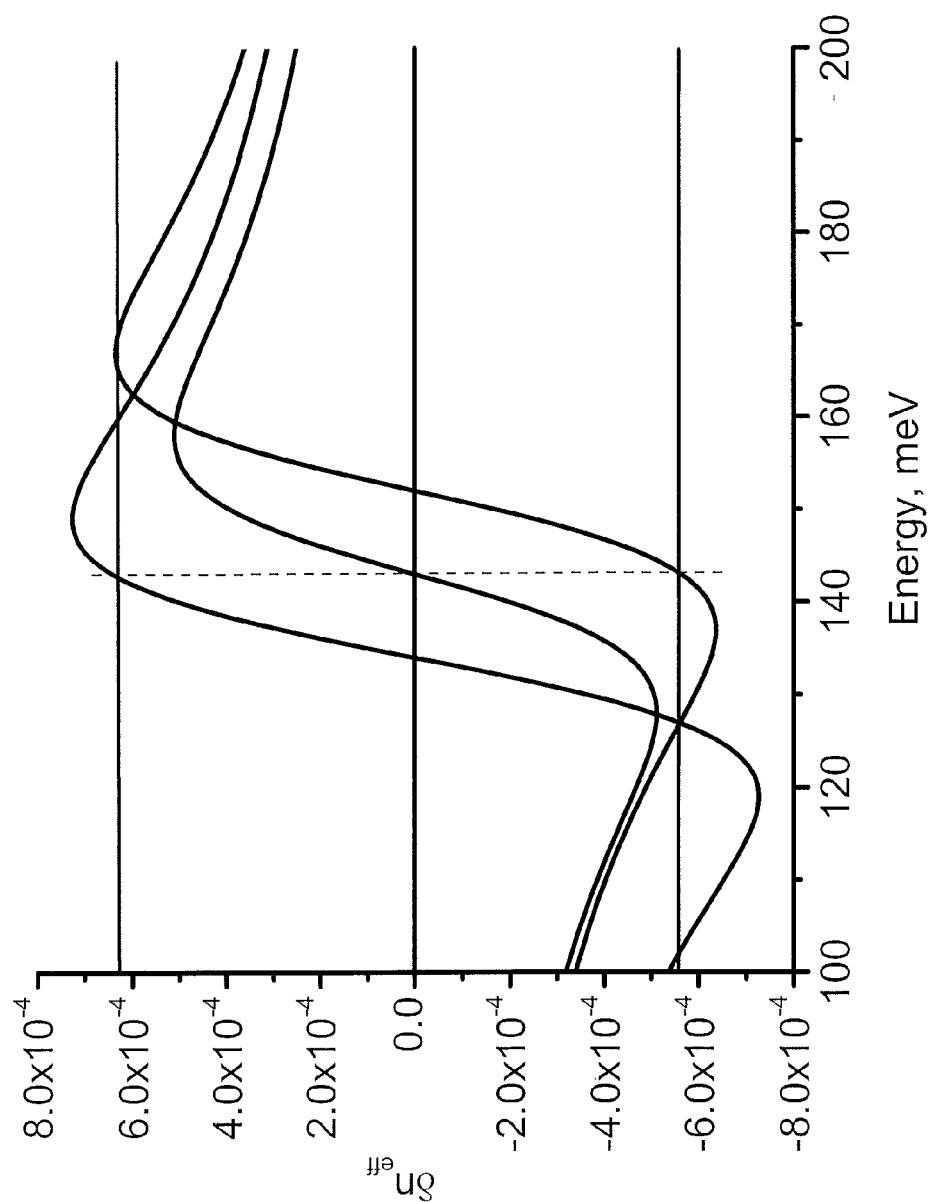
FIG. 6 illustrates the variation of the effective refraction index as a function of energy at different electric fields: 30 kV/cm; 40 kV/cm; and 50 kV/cm. The vertical line marks the average laser emission quantum energy ($\omega_{LO}$=143 meV), and the horizontal lines indicate the variation range of the refractive index.

Here J is the current density, $\tau_1$, $\tau_2$ are electron lifetimes in the upper and lower laser states, respectively, $\tau_{12}$ electron transition time between these levels, $N_P$ is the number of cascades in the QCL, $\Gamma_P$ is optical confinement factor per cascade, $L_P$ is the length of one cascade, c is the speed of light in vacuum and $n_{eff}$ is the effective refractive index of the mode. Both the dipole matrix element and the effective refractive index are functions of the electric field. In a first approximation these dependencies can be neglected since the expected variation of the effective refraction index is within $10^{-3}$ and, as can be seen from FIG. 6, the average coordinate matrix element is about 1.9 nm and it does not experience strong variations with the electric field. The contribution of the laser gain to the variation of the effective refractive index at frequency $\omega$ can be estimated as:

$$\delta n_{eff} \approx \frac{c}{2} \cdot G_0 \cdot \frac{\omega - \omega_{12}(F)}{(\omega_{12}(F) - \omega)^2 + \gamma_{12}^2} \quad (8)$$

After threshold, the laser gain G is pinned at the lasing frequency $\omega_L$ which is determined by a DFB grating period $\Lambda$ and a value of $n_{eff}$;

$$\omega_L \approx \frac{\pi c}{\Lambda n_{eff}}.$$

This can be expressed as $$G(\omega_L(F)) = \alpha_{tot} \quad (9)$$

The gain pinning is maintained even at high modulation frequencies due to the suppression of a relaxation resonance in QCLs. Taking into account expression (7), the variation of the effective refractive index at the lasing frequency can then be written as:

$$\delta n_{eff}(\omega_L(F)) \approx \frac{c}{2} \cdot \frac{\alpha_{tot}}{\gamma_{12}} \cdot \frac{\omega_L(F) - \omega_{12}(F)}{\omega_L(F)} \quad (10)$$

To solve Eq. (10) we note that the expected tuning range of a DFB laser wavelength ($\omega_L$) in our devices is much smaller than the Stark tuning range of the optical gain. We can then replace $\omega_L(F)$ to a constant $\omega_{L0}$ corresponding to the DFB laser emission frequency at the laser threshold. Taking $\alpha_{tot}=15$ cm$^{-1}$, $2\gamma_{12}=30$ meV and using data of the FIG. 5 for the laser gain tuning range above threshold, we calculate the variation of the effective refraction index as $\sim 1.2\times 10^{-3}$. In terms of frequency, the tuning range is $\sim 13.3$ GHz.

Figure 7:
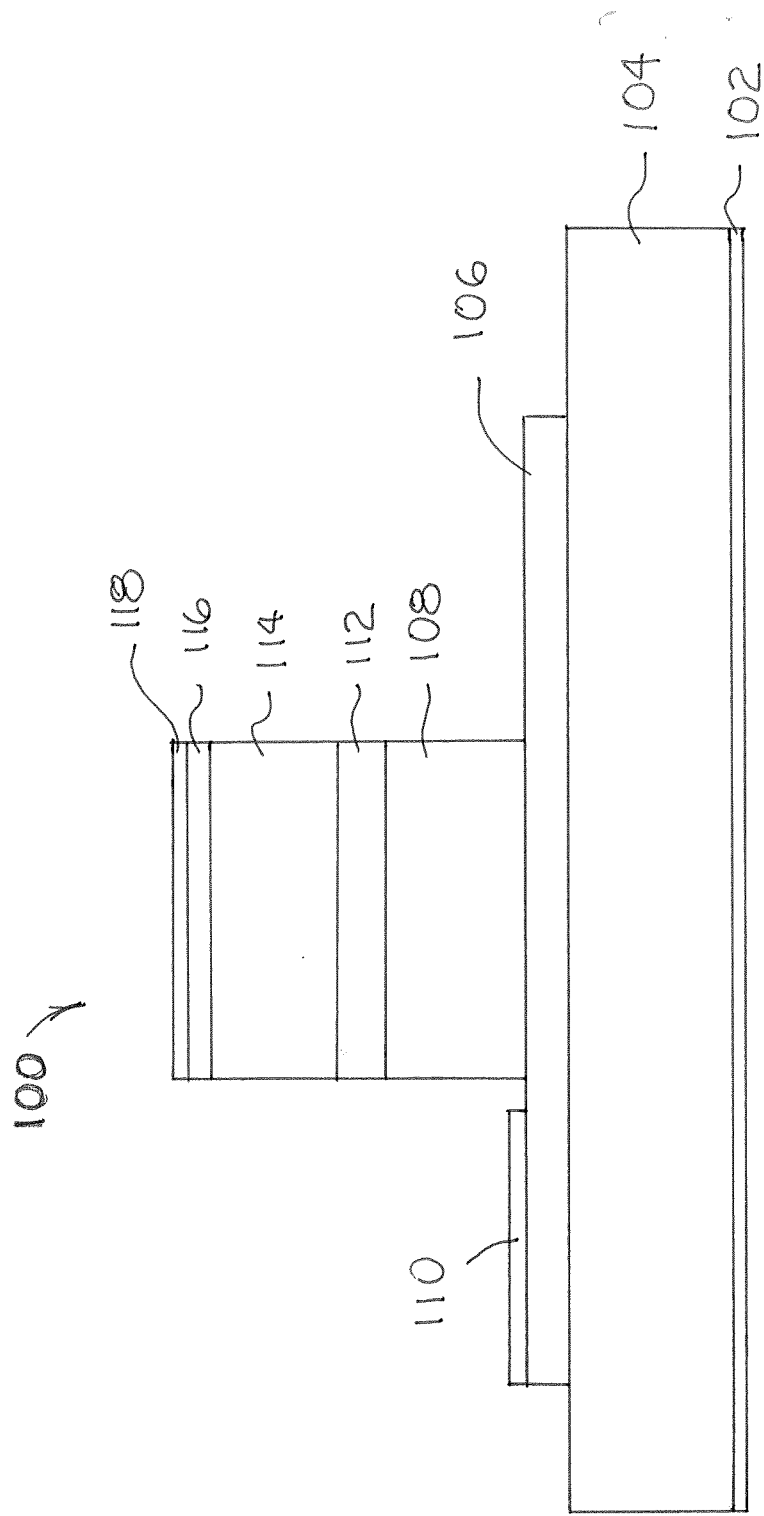
FIG. 7 is a partially schematic diagram of a tunable QCL in accordance with another embodiment of the present invention. The structure of an FM DFB QCL is based on the refractive index modulation of the RIV layer that results in a change in the effective refractive index of the optical mode (due to its partial overlap with the RIV layer) which leads to a tuning of the laser wavelength. The QCL is DC biased through the top contact and the index modulation section is RF-biased through the bottom contact.

In another embodiment of the invention, the refractive index is controlled through the Stark tuning of the additional polarization transition (PT) frequency. FIG. 7 illustrates a tunable QCL 100 in accordance with this embodiment. The tunable QCL 100 shown in FIG. 8 includes a contact layer 102 made of titanium, nickel, gold, or platinum having a thickness of from about 0.1 micron to about 1 micron. A conductive substrate and waveguide cladding layer 104 is provided on the contact layer 102. The waveguide cladding layer 104 may be made of InP, InP, InAs, GaSb, GaAs, InSb having a typical thickness of from about 50 micron to about 500 micron. A refractive index modulation layer 106 is provided on the waveguide cladding layer 104. The refractive index variation layer 106 may be made of GaInAs, AlInAs, GaSb, InAs, AlSb, GaAs, AlGaAs or InSb, having a typical thickness of from about 0.1 micron to about 1 micron. An active region 108 is provided over a portion of the refractive index modulation layer 106. The active region 108 may be made of GaInAs and AlInAs. GaSb, InAs, AlSb, GaAs, AlGaAs, InSb, having a typical thickness of from about 1 micron to about 4 micron. An exposed surface of the refractive index modulation layer 106 includes a ground layer 110 made of titanium, nickel, gold, or platinum having a typical thickness of from about 0.1 micron to about 1 micron. A DFB grating region layer 112 is provided over the active region 108. The DFB grating region 112 may be made of GaInAs, AlInAs, GaSb, InAs, AlSb, GaAs, AlGaAs or InSb, having a thickness of from about 0.5 micron to about 2 micron. A waveguide cladding layer 114 is provided over the DFB grating region 112. The waveguide cladding layer may be made of AlInAs, GaInAs, GaSb, AlSb, GaAs or AlGaAs, having a thickness of from about 1 micron to about 5 micron. A highly doped plasmon confinement layer 116 is provided over the DFB grating layer 112. The plasmon confinement layer 116 may comprise InP, InAs, GaSb, GaInAs, AlInAs or InSb doped with higher levels of impurity concentration than used closer to the active region. The plasmon confinement layer 116 has a typical thickness of from about 0.5 micron to about 2 micron. A DC laser bias layer 118 is provided over the plasmon confinement layer 116. The DC laser bias layer may be made of titanium, nickel, gold, or platinum having a thickness of from about 0.1 micron to about 1 micron.

Figure 8A:
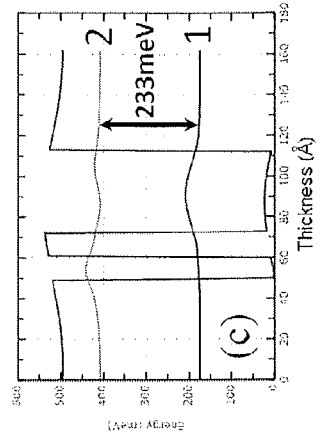
FIGS. 8A and 8B illustrate the dispersion of the real and imaginary parts of the refractive index for TM-polarized light in an n-doped $In_{0.53}Ga_{0.47}As/Al_{0.48}In_{0.52}As$ coupled quantum well semiconductor heterostructure, shown in FIGS. 8C and 8D under zero bias (solid line; calculated bandstructure shown in FIG. 8C) and a bias field of −150 kV/cm (dashed line; calculated bandstructure shown in FIG. 8D). The semiconductor layer thicknesses for the heterostructure (in nm) are 5.0/1.1/1.2/4.0/5.0 where $Al_{0.48}In_{0.52}As$ barriers are indicated in bold. We have assumed the structure is modulation doped in 5.0 nm-thick $A_{0.48}In_{0.52}As$ barriers to have an average electron doping density of $5\times10^{17}$ cm$^{-3}$. The linewidth for the transition between states 1 and 2 is assumed to be 14 meV full width at half maximum. Intersubband transitions from state 1 to states above state 2 have transition dipole moments at least a factor of 2.5× smaller than that from state 1 to state 2 and transition energies further away from the proposed laser operating wavelength of $\lambda\approx10$ μm, and have been eliminated in these calculations.
Figure 8B:
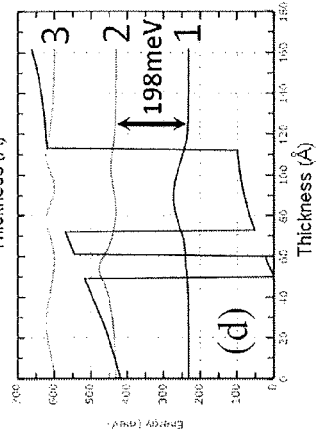
Figure 8C:
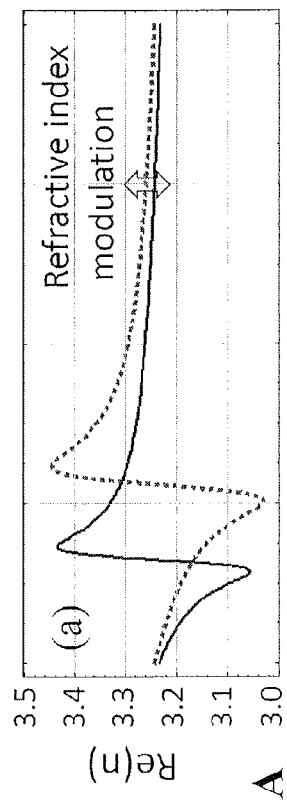
Figure 8D:
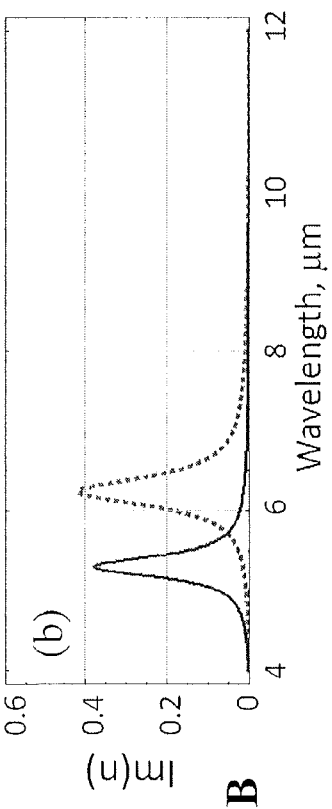

In the embodiment of FIG. 7, the effective refractive index is controlled by introducing an additional index variation layer into the laser structure. To realize this approach, a specially designed refractive index variation (RIV) layer is introduced into the laser structure below the active region. The RIV layer is a periodic multi-quantum-well structure. Each period of the RIV contains two energy levels ('1' and '2') which form a PT. As the voltage is applied to the RIV layer, the PT energy changes due to the Stark effect. Tuning the transition energy in the RIV section will result in tuning $n_{eff}$ at the QCL operating frequency and hence, tuning of the laser emission wavelength in accordance with:

$$\lambda \approx 2\times \Lambda \times n_{eff} \quad (11),$$

where $\Lambda$ is the DFB grating period. Devices based on transitions between electron states in quantum wells are intrinsically TM-polarized, and this embodiment is focused on TM-polarized modes only. FIGS. 8A and 8B illustrate the dispersion of the real and imaginary parts of the refractive index for TM-polarized light in an n-doped $In_{0.53}Ga_{0.47}As/Al_{0.48}In_{0.52}As$ coupled quantum well semiconductor heterostructure, shown in FIGS. 8C and 8D under zero bias (solid line) and a bias field of −150 kV/cm (dashed line). The semiconductor layer thicknesses for the heterostructure (in nm) are 5.0/1.1/1.2/4.0/5.0 where $Al_{0.48}In_{0.52}As$ barriers are indicated in bold. The structure is assumed to be modulation doped in 5.0 nm-thick $Al_{0.48}In_{0.52}As$ barriers to have an average electron doping density of $5\times 10^{17}$ cm$^{-3}$. The linewidth for the transition between states 1 and 2 is assumed to be 14 meV full width at half maximum. Intersubband transitions from state 1 to states above state 2 have transition dipole moments at least a factor of 2.5 smaller than that from state 1 to state 2 and transition energies further away from the proposed laser operating wavelength of $\lambda \approx 10$ μm. As a result, they were neglected in these calculations.

The voltage on the RIV layer shown in FIG. 7 is controlled through the separate electrode. The FM DFB QCL is based on refractive index modulation using the Stark shift of an intersubband absorption in the index modulation section integrated below the cascaded active region. The QCL is DC biased through the top contact and the index modulation section is RF-biased through the bottom contact.

As an example, a device that is based on a InGaAs/AlInAs heterostructure lattice-matched to an InP substrate may be made of the following layers (starting from the substrate): an InP substrate n-doped to $5\times 10^{16}$ cm$^{-3}$; a 500 nm-thick InGaAs/AlInAs refractive index modulation layer; a 50 nm-thick etch-stop InP layer n-doped to $1\times 10^{17}$ cm$^{-3}$; a 2.1 μm-thick InGaAs/AlInAs active region that consists of 35 cascaded stages based on a 2-phonon, multiple phonon, or a bound-to-continuum design that emits at $\lambda \approx 10$ μm; a 500 nm-thick InGaAs layer n-doped to $3\times 10^{16}$ (this layer will be used for DFB grating fabrication); a 3.5 μm-thick InP upper cladding layer n-doped to $5\times 10^{16}$ cm$^{-3}$; and a 0.2 μm-thick InP contact layer n-doped to $5\times 10^{18}$ cm$^{-3}$. This layer sequence is essentially that of a standard DFB QCL design with an addition of a RIV layer and lateral current extraction layer. The lateral current extraction to the ground contact in the devices is achieved through the top several stages of the RIV structure. The ground contact may be positioned approximately 20 microns away from an approximately 20 μm-wide laser ridge, and a 2D electron gas in the RIV structure will have sufficient conductivity for lateral current extraction over the required distance (approximately 40 μm) as demonstrated for various QCL designs with lateral current injection/extraction.

The RIV layer in the sample structure starts with a 10-nm-thick AlInAs layer followed by 30 repetitions of the InGaAs/AlInAs layer sequence with thicknesses (in nm) 1.1/1.2/4.0/10.0, where the thicknesses of AlInAs layers are indicated in bold. The central 8 nm sections in 10-nm-thick AlInAs layers are n-doped to $1\times 10^{18}$ cm$^{-3}$ which results in the average doping density for the RIV layer of $5\times 10^{17}$ cm$^{-3}$.

Figure 9A:
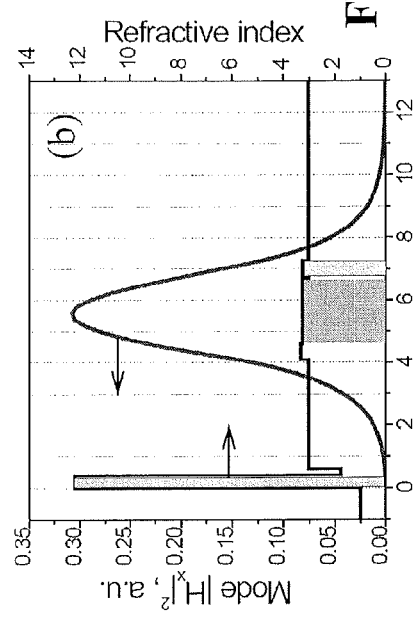
FIGS. 9A-9C are graphs illustrating various operating characteristics of the tunable QCL of FIG. 7.

FIG. 9A shows the refractive index profile and the laser mode in the device. The laser mode has an overlap factor with the active region $\Gamma_{AR}\approx 0.58$ and an overlap factor with the RIV layer $\Gamma_{RIV}\approx 0.11$.

Figure 9C:
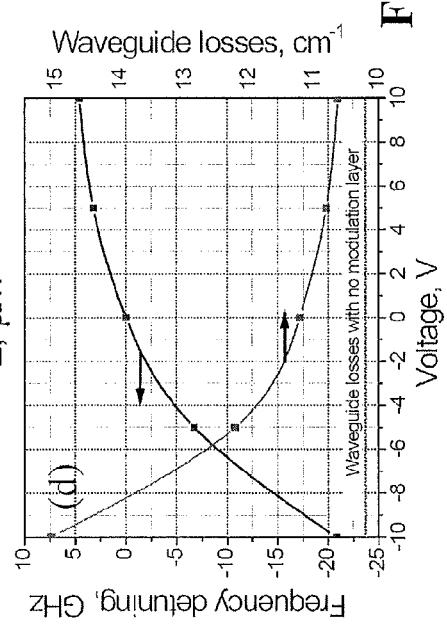
Figure 9B:
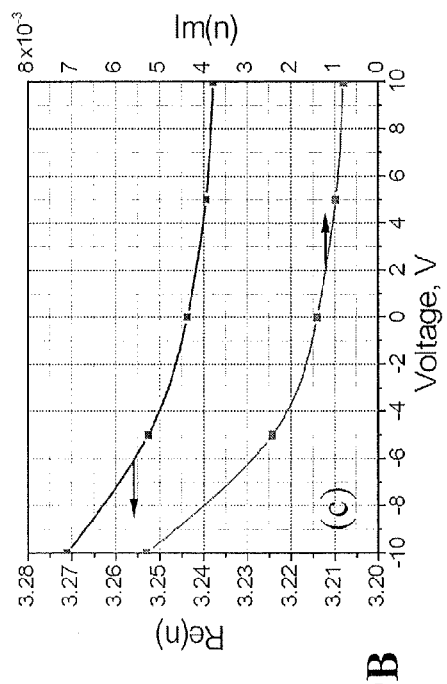

The real and imaginary values of the refractive index at different bias voltages across a 500 nm-thick RIV layer are plotted in FIG. 9B, where calculated values of $z_{12}$ and $\omega_{12}$ are used for the RIV structure at different bias voltages and assumed $2\gamma_{12}=14$ meV.

The frequency detuning ($\Delta\nu$) and the waveguide losses for a $TM_0$ mode as a function of bias voltage across the RIV layer in the device discussed above are plotted in FIG. 9C. We have assumed the laser has a DFB grating designed for emission at 10 μm (ν=30 THz) at zero bias across the RIV layer. The waveguide losses for a QCL with a 500 nm-thick InGaAs layer n-doped to $3\times10^{16}$ instead of the RIV layer are shown by a dashed line in FIG. 9C. The results indicate that we can achieve fast frequency tuning over $\Delta\nu\approx25$ GHz or 0.83 cm$^{-1}$ (from 29.980 THz at −10V bias to 30.005 THz at +10V bias) while keeping waveguide losses no more than 50% above that of a QCL without the RIV layer.

The frequency tuning in the devices may be increased in a number of ways, including increasing the doping density in the RIV layer, increasing the transition dipole moment $z_{12}$ for the intersubband transition in the RIV layer, making the RIV layer thicker to increase its overlap with the laser mode, or by designing the RIV structure for higher voltage-tenability of the intersubband transition energy. As seen in FIG. 9C, the refractive index variation amplitude in the proposed devices is related to the optical losses introduced by the RIV layer. The latter cannot be too large in order to have a high-performance QCL.

The fundamental limits of this frequency tuning method are derived below using Eq. (3). To keep optical losses in the index modulation layer low, the intersubband transition frequency $\omega_{12}\equiv\omega_{PT}$ must be well detuned from the laser operating frequency $\omega$. Assuming the modulation amplitude of the intersubband transition frequency $\Delta\omega_{12}$ is smaller than $(\omega_{12}-\omega)$, we can express the amplitude of the refractive index modulation in the index modulation layer as $$\Delta n(\omega) \approx \frac{N_e(ez_{12})^2 \Delta\omega_{12}}{2n_{core}(\omega)\varepsilon_0 \hbar(\omega_{12}-\omega)^2} \quad (12)$$

where we have assumed $(\omega_{12}-\omega)\gg\gamma_{12}$. The modulation amplitude of the effective refractive index of the laser mode, $\Delta n_{\mathit{eff}}$, is then given as:

$$\Delta n_{\mathit{eff}}(\omega))=\Delta n(\omega)\times\Gamma_{RIV}, \quad (13)$$

where $\Gamma_{RIV}$ is the modal overlap with the RIV layer. The optical losses in the RIV layer are given as $$\alpha_{mod} \approx \frac{2\omega}{c}\text{Im}(n(\omega)) \approx \frac{\omega}{c}\frac{N_e(ez_{12})^2\gamma_{12}}{n_{core}(\omega)\varepsilon_0\hbar(\omega_{12}-\omega)^2} \quad (14)$$

where $\omega$ is the laser operating frequency and we have assumed $\text{Im}(n_{core})\approx0$ and $(\omega_{12}-\omega)\gg\gamma_{12}$. The additional optical losses for the laser mode introduced by the RIV layer are given as $$\alpha_{extra}=\alpha_{mod}\times\Gamma_{RIV}. \quad (15)$$

From Eqs. (4-7) we see that the optical losses and the refractive index modulation amplitude are related as:

$$\frac{\Delta n_{\mathit{eff}}}{\alpha_{extra}} = \frac{c}{\omega}\frac{\Delta\omega_{12}}{2\gamma_{12}} \quad (16)$$

where $\omega$ is the laser operating frequency.

Equation (16) determines the fundamental limits of frequency tuning using DFB QLCs with an RIV layer. Assuming $2\Delta\gamma_{12}\approx14$ meV [13], $\alpha_{extra}=10$ cm$^{-1}$, and a value of $\Delta\omega_{12}\approx150$ meV achievable with diagonal intersubband transitions, that may utilize strain-compensated InGaAs/AlInAs heterostructures to increase the conduction band offset, we obtain from Eq. (16) that we are able to achieve the effective refractive index tuning by $\Delta n_{\mathit{eff}}=1.7\times10^{-2}$. This value translates into a frequency tuning of $\Delta\nu=160$ GHz (5.4 cm$^{-1}$) for $\lambda\approx10$ μm (30 THz) QCLs, cf. Eq. (11).

Whereas particular embodiments of this invention have been described above for purposes of illustration, it will be evident to those skilled in the art that numerous variations of the details of the present invention may be made without departing from the scope of the invention.

The invention claimed is:

1. A tunable quantum cascade laser comprising:
an optically active region including at least one cascaded stage comprising an injection section and an active section, wherein the injection and active sections are separated by a barrier layer and comprise multiple quantum well layers and barrier layers, and each active section supports electronic states that provide for a lasing optical transition whose energy separation is controlled by the application of an applied electric field;
means for pumping electrons through the active region by applying a bias voltage to the optically active region with a pair of conducting layers disposed on opposite sides of the optically active region;
means for modulating a transverse electric field in the optically active section of each cascaded stage after a lasing threshold is reached by changing the bias voltage that is applied to the optically active region by the pair of conducting layers thereby modulating wavelengths of laser light emitted in the lasing optical transition between electronic states in the active section of each cascaded stage;
a region located proximal to one side of the optically active region comprising a grating structure that provides for wavelength selective reflections of optical waves propagating through the optically active region; and
means for confining optical waves to the active section.

2. The tunable quantum cascade laser of claim 1, wherein one of the conductive layers comprises a ground layer comprising titanium, nickel, gold and/or platinum having a thickness of from about 0.1 micron to about 1 micron.

3. The tunable quantum cascade laser of claim 1, wherein the means for confining optical waves to the active section comprises a waveguide cladding layer comprising InP, InAs, GaSb, GaAs and/or InSb having a thickness of from about 50 micron to about 500 micron.

4. The tunable quantum cascade laser of claim 1, wherein the active region comprises GaInAs, AlInAs, GaSb, InAs, AlSb, GaAs, AlGaAs and/or InSb, and has a thickness of from about 1 micron to about 4 micron.

5. The tunable quantum cascade laser of claim 1, wherein the grating structure comprises GaInAs, AlInAs, GaSb, InAs, AlSb, GaAs, AlGaAs and/or InSb, and has a thickness of from about 0.5 micron to about 2 micron.

6. The tunable quantum cascade laser of claim 1, further comprising a waveguide cladding layer adjacent to the grating structure comprising AlInAs, GaInAs, GaSb, AlSb, GaAs and/or AlGaAs having a thickness of from about 1 micron to about 5 micron.

7. The tunable quantum cascade laser of claim 1, wherein the means for confining optical waves to the active section comprises a plasmon confinement layer comprising InP, InAs, GaSb, GaInAs, AlInAs and/or InSb having a thickness of from about 0.5 micron to about 2 micron.

8. The tunable quantum cascade laser of claim 1, wherein one of the conductive layers comprises a laser bias layer comprising titanium, nickel, gold and/or platinum having a thickness of from about 0.1 micron to about 1 micron.

* * * * *